United States Patent [19]

Koch

[11] Patent Number: 4,906,943

[45] Date of Patent: Mar. 6, 1990

[54] DIFFERENTIAL OPERATIONAL AMPLIFIER WITH COMMON MODE FEEDBACK

[75] Inventor: Rudolf Koch, Unterhaching, Fed. Rep. of Germany

[73] Assignee: Siemens Aktiengesellschaft, Munich, Fed. Rep. of Germany

[21] Appl. No.: 323,690

[22] Filed: Mar. 15, 1989

[30] Foreign Application Priority Data

Sep. 5, 1988 [DE] Fed. Rep. of Germany ....... 3830150

[51] Int. Cl.$^4$ .............................................. H03F 3/16
[52] U.S. Cl. .................................... 330/258; 330/277; 330/9
[58] Field of Search .................... 330/9, 107, 252, 253, 330/255, 258, 259, 264, 277

[56] References Cited

U.S. PATENT DOCUMENTS 3,530,395 9/1970 Prusha ............................ 330/258 X
4,697,152 9/1987 Westwick ............................ 330/9

Primary Examiner—Steven Mottola
Attorney, Agent, or Firm—Herbert L. Lerner; Laurence A. Greenberg

[57] ABSTRACT

A circuit configuration includes a differential operational amplifier having differential input terminals and differential output terminals. A common mode feedback circuit sets a direct voltage operating point of the output terminals. A reference voltage terminal connected to the output terminals supplies a reference voltage. Two pairs of operating point transistors of complementary conductivity types have control terminals and have output circuits connected in series at a respective connection point for each pair. Each of the connection points is connected to a respective one of the output terminals. A reference current source controls the operating point transistors in parallel. First coupling capacitors are each connected between a respective one of the output terminals and a respective one of the control terminals of an associated operating point transistor of one conductivity type. The common mode feedback circuit includes second coupling capacitors and a remainder of the common mode feedback circuit. The second coupling capacitors are each connected between a respective one of the output terminals and a respective one of the control terminals of an associated operating point transistor of a conductivity type complementary to the one conductivity type, for decoupling the first coupling capacitors and the associated operating point transistors from the remainder of the common mode feedback circuit.

2 Claims, 1 Drawing Sheet

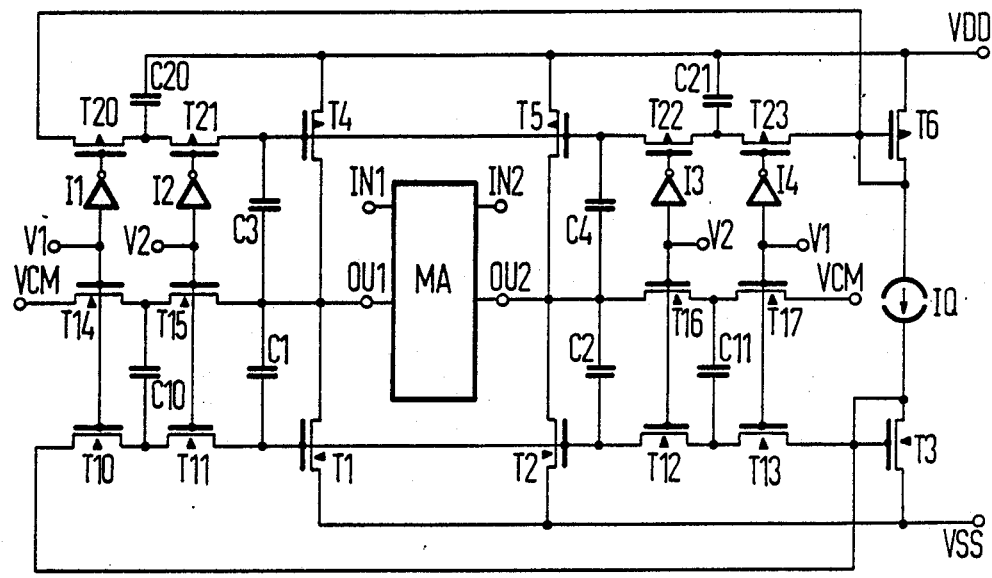

DIFFERENTIAL OPERATIONAL AMPLIFIER WITH COMMON MODE FEEDBACK

The invention relates to a circuit configuration including a differential operational amplifier having both a differential input and a differential output, the direct voltage operating point of the differential output being set by a common mode feedback circuit, the output terminals of the differential output being firstly connected to a terminal carrying a reference voltage, the output terminals being secondly connected to connection points of each two respective operating point transistors being of complementary conductivity type, having output circuits connected in series and each being controlled in parallel by a reference current source, the output terminals being thirdly connected through a respective coupling capacitor to the control terminal of a respectively associated operating point transistor of one conductivity type, and the coupling capacitors and the associated operating point transistors being decoupled from the remainder of the common mode feedback circuit Integrated circuits with stringent requirements in terms of linearity, vulnerability to disturbance on the supply lines and/or dynamic range frequently use fully differential operational amplifiers, in other words operational amplifiers having a differential input and a differential output. Such operational amplifiers can meet the necessary requirements even with a unipolar supply voltage of +5V, for example. Other advantages are that for optimizing the modulation range, fully differential operational amplifiers may have different common mode input direct voltages and common mode output direct voltages and that with them, disturbance from the supply side can be suppressed.

Although in fully differential operational amplifiers the differential output voltage depends on the differential input voltage, in any case the common mode direct voltage operating point at the output must be defined. Particularly when such an operational amplifier is used in combination with purely capacitive coupling, such as in a switched capacitor filter, the direct voltage operating point at the output terminals of the differential output must be set by a common mode feedback, or CMFB. This external wiring of the operational amplifier serves at the same time to suppress common mode signals at the output In order to attain the maximum output rise, the direct voltage operating point at the output is preferably located midway between the two potentials of the supply voltage source.

A fully differential operational amplifier with common mode feedback is known from the paper by R. Castello and P. R. Gray, entitled "A 350 $\mu$W Fifth-Order Low-Pass Switched Capacitor Filter", IEEE International Solid-State Circuits Conference 1985, page 276. The CMFB described therein has two operating point transistors of complementary types connected with the output circuits thereof in series and disposed symmetrically with respect to each output terminal of the differential operational amplifier. These transistors are disposed between the supply voltage source and are controlled with the aid of a current mirror from a current source. Each connecting point of the output circuits of the operating point transistors is connected to an output terminal of the differential operational amplifier and at the same time to a terminal that carries the potential of the CMFB.

A capacitor is provided between each output terminal of the differential operational amplifier and the control terminal of the respective n-conductive operating point transistor, in order to generate an alternating-voltage path for the common mode output signal. These coupling capacitors are uncoupled from the terminal having the common mode direct voltage potential and the current mirror transistor controlling the applicable operating point transistor with the aid of high-impedance line elements by switched capacitor technology. In this way, an unrestricted output rise, with low power loss and high linearity, is attained up to just below the supply voltage. The known CMFB is capable of rapid modulation of positive common mode signals, because in that case the n-conductive operating point transistors become conductive. However, the speed for modulation of negative common mode signals is limited by the p-conductive operating point transistors functioning as current sources.

It is accordingly an object of the invention to provide a differential operational amplifier with common mode feedback, which overcomes the hereinafore-mentioned disadvantages of the heretofore-known devices of this general type and which optimizes the modulation speed with common mode signals of negative polarity.

With the foregoing and other objects in view there is provided, in accordance with the invention, a circuit configuration, comprising a differential operational amplifier having differential input terminals and differential output terminals, a common mode feedback circuit for setting a direct voltage operating point of the output terminals, a reference voltage terminal connected to the output terminals for supplying a reference voltage, two pairs of operating point transistors of complementary conductivity types having control terminals and having output circuits connected in series at a respective connection point for each pair, each of the connection points being connected to a respective one of the output terminals, a reference current source controlling the operating point transistors in parallel, first coupling capacitors each being connected between a respective one of the output terminals and a respective one of the control terminals of an associated operating point transistor of one conductivity type, the common mode feedback circuit including second coupling capacitors and a remainder of the common mode feedback circuit, the second coupling capacitors each being connected between a respective one of the output terminals and a respective one of the control terminals of an associated operating point transistor of a conductivity type complementary to the one conductivity type, for decoupling the first coupling capacitors and the associated operating point transistors from the remainder of the common mode feedback circuit.

The circuit configuration according to the invention has the advantage that while maintaining low expense for the CMFB, the direct voltage operating point at the output terminals of the differential operational amplifier is modulated reliably and quickly in the positive or negative direction, even in the case of rapid changes in the common mode signal.

In accordance with a concomitant feature of the invention, there are provided first line elements in switched capacitor technology for decoupling the second coupling capacitors and the associated operating point transistors from the remainder of the common mode feedback circuit, and corresponding second line elements between the output terminals and the reference voltage terminal, the operating point transistors including n-conductive and the p-conductive transistors, the first and the second line elements having switches, and the switches of the first line elements being complementary to the switches of the second line elements, the control terminals of the n-conductive operating point transistors and the reference current source and being controlled inversely thereto.

Other features which are considered as characteristic for the invention are set forth in the appended claims.

Although the invention is illustrated and described herein as embodied in a differential operational amplifier with common mode feedback, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the drawing.

The drawing is a schematic circuit diagram of a circuit according to the invention, using the switched capacitor technique.

Referring now in detail to the single FIGURE of the drawing, there is seen a fully differential operational amplifier which is shown as a block MA and which is of the kind that can be found in in the above-cited publication by R. Castello and P. R. Gray. The differential operational amplifier MA has two differential inputs or input terminals IN1 and IN2 as well as two differential outputs or output terminals OU1 and OU2. The common mode feedback (CMFB) circuit includes two symmetrical circuit portions, each of which is associated with one output terminal OU1 of the operational amplifier MA. The description of the invention will therefore be restricted to the circuit portion associated with the output terminal OU1, while indicating the various equivalent components for the circuit portion associated with the other output terminal in parentheses.

Series-connected output circuits of two complementary operating point transistors T1 and T4 (T2 and T5) are connected between connections VDD and VSS for the connection of a supply voltage source. Depending on the line or conductivity type, the operating point transistors are controlled in pairs (T1 and T2 as well as T4 and T5) with the aid of a current mirror configuration formed of transistors T3 and T6 and a current source IQ. Elements T3, IQ and T6 are connected in series between the terminals VDD and VSS. The drain and gate terminals of each respective transistor T3 and T6 are connected to one another and to the control terminals of the transistors T1 and T2 or T4 and T5, respectively. The control terminals of the transistors T1 and T2 as well as of the transistors T4 and T4 are connected directly to one another.

On one hand, the output terminal OU1 (OU2) is connected to the connection point between the output circuits of the transistors T1 and T4 (T2 and T5) and on the other it is connected to a reference voltage terminal VCM for the connection of a direct voltage operating point potential. On one hand a first coupling capacitor C1 (C2) is located between the output terminal OU1 (OU2) and the control terminal of the transistor T1 (T2) and on the other hand a second coupling capacitor C3 (C4) is located between the output terminal OU1 (OU2) and the control terminal of the transistor T4 (T5).

The operating point transistors T1 and T4 (T2 and T5), in combination with the direct voltage at the terminals VCM, regulate the direct voltage operating point at the output of the differential amplifier MA. Upon rapid changes in the common mode, the coupling capacitors C1 and C3 (C2 and C4) provide for an alternating voltage coupling of the output terminal OU1 (OU2) and the respective control terminal of the operating point transistor. Due to the connection of a coupling capacitor for both the n-conductive and the p-conductive operating point transistor, this alternating voltage coupling is effective for both positive and negative changes in the common mode signal. The disposition of the coupling capacitors greatly increases the current productivity of the operating point transistors T1 and T4 (T2 and T5), enabling rapid modulation of common mode changes.

However, in order to attain the effect provided according to the invention in both the positive and the negative direction upon rapid common mode changes, it is necessary to decouple the coupling capacitors C1 and C3 (C2 and C4) having the operating point transistors from the remainder of the CMFB, because otherwise the signal capacitively coupled to the control terminals of the operating point transistors would be excessively damped. Therefore, each terminal of one coupling capacitor C1 or C3 (C2 or C4) is connected through switches to the remainder of the CMFB For this purpose, two transistors T10 and T11 (T12 and T13) having output circuits connected in series, are provided for the two terminals of the coupling capacitor C1. The output circuits of the transistors T10 and T11 (T12 and T13) are connected between the connection point of the coupling capacitor C1 (C2) at the control terminal of the transistor T1 (T2) and the drain/gate terminal of the transistor T3.

The other terminal of the coupling capacitor C1 (C2), which simultaneously forms a terminal of the coupling capacitor C3 (C4), is connected to the terminal VCM through two transistors T14 and T15 (T16 and T17) which have output circuits connected in series. Finally, the connection point of the coupling capacitor C3 (C4) and the control terminal of the transistor T4 (T5) is connected to the drain/gate terminal of the transistor T6, through two transistors T20 and T21 (T22 and T23) which have output circuits connected in series. A capacitor C10 (C11) is connected between the connecting points of the output circuits of the transistors T10 and T11 (T12 and T13) and the transistors T14 and T15 (T16 and T17). The connection point between the transistors T20 and T21 (T22 and T23) is connected to the terminal VDD through a capacitor C20 (C21).

A clock signal present at a terminal V1 controls the transistors T10 and T14 (T13 and T17) directly, and controls the transistor T20 (T23) through an inverter I1 (I4). Another clock signal which is present at another terminal V2 and which is preferably of opposite phase from the clock signal present at the terminal V1, controls the transistors T11 and T15 (T12 and T16) directly and controls the transistor T21 (T22) through an inverter I2 (I3).

The decoupling circuit described for each terminal of the coupling capacitors C1 and C3 (C2 and C4) forms high-resistance line elements in switched capacitor technology including first line elements T20-T23, C20, C21 and corresponding second line elements between the output terminals OU1, OU2 and the reference voltage terminal VCM. The controlled switches of these line elements are controlled inversely, in accordance with the complementary types of transistors used to make them.

The invention is naturally usable in the same manner in a configuration of complementary or inverse structure with respect to the line capacity or conductivity type of the transistors or voltage source.

The foregoing is a description corresponding in substance to German Application No. P 38 30 150.4, dated Sept. 5, 1988, the International priority of which is being claimed for the instant application, and which is hereby made part of this application. Any material discrepancies between the foregoing specification and the aforementioned corresponding German application are to be resolved in favor of the latter.

I claim:

1. A circuit configuration, comprising a differential operational amplifier having differential input terminals and differential output terminals, a common mode feedback circuit for setting a direct voltage operating point of said output terminals, a reference voltage terminal connected to said output terminals for supplying a reference voltage, two pairs of operating point transistors of complementary conductivity types having control terminals and having output circuits connected in series at a respective connection point for each pair, each of said connection points being connected to a respective one of said output terminals, a reference current source controlling said operating point transistors in parallel, first coupling capacitors each being connected between a respective one of said output terminals and a respective one of said control terminals of an associated operating point transistor of one conductivity type, said common mode feedback circuit including second coupling capacitors and a remainder of said common mode feedback circuit, said second coupling capacitors each being connected between a respective one of said output terminals and a respective one of said control terminals of an associated operating point transistor of a conductivity type complementary to said one conductivity type, for decoupling said first coupling capacitors and said associated operating point transistors from said remainder of said common mode feedback circuit.

2. Circuit configuration according to claim 1, including first line elements in switched capacitor technology for decoupling said second coupling capacitors and said associated operating point transistors from said remainder of said common mode feedback circuit, and corresponding second line elements between said output terminals and said reference voltage terminal, said operating point transistors including n-conductive and the p-conductive transistors, said first and said second line elements having switches, and said switches of said first line elements being complementary to said switches of said second line elements, said control terminals of said n-conductive operating point transistors and said reference current source and being controlled inversely thereto.

* * * * *